Figure 2:
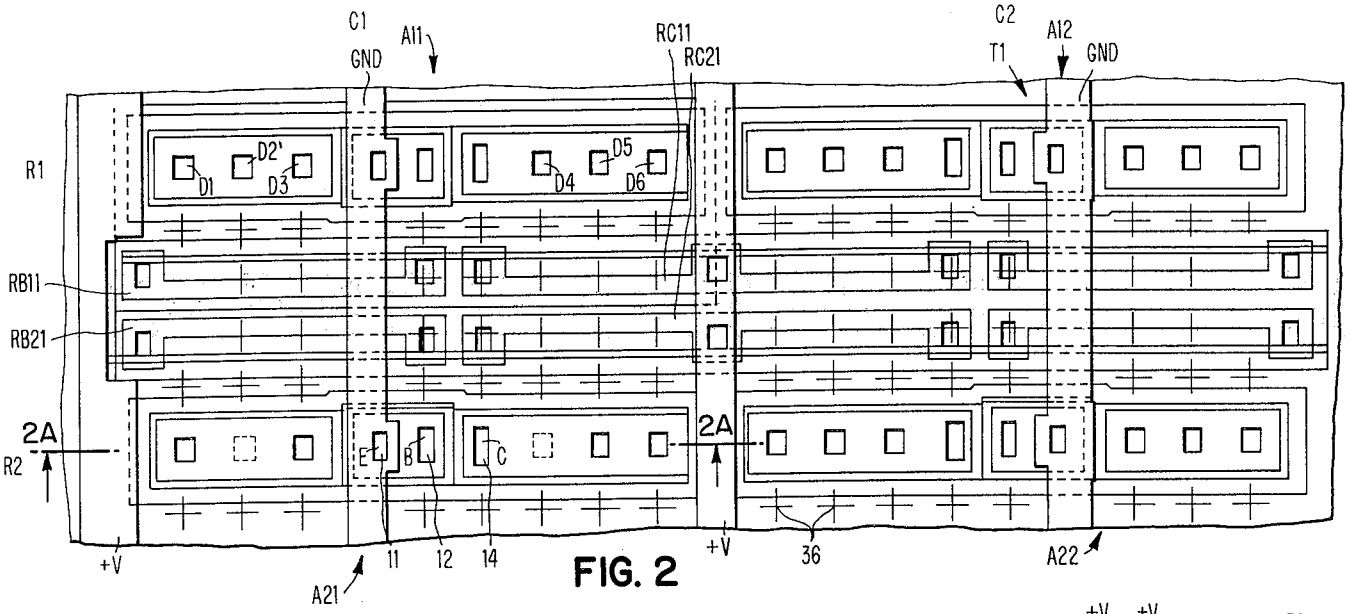
Figure 1:
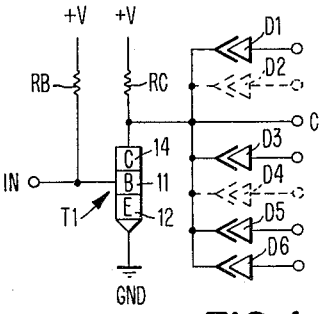
Figure 2A:
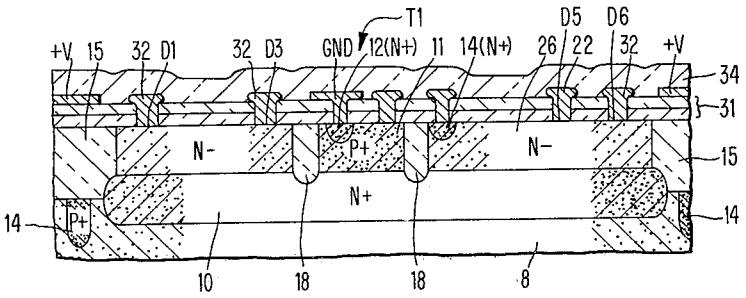
Figure 3:
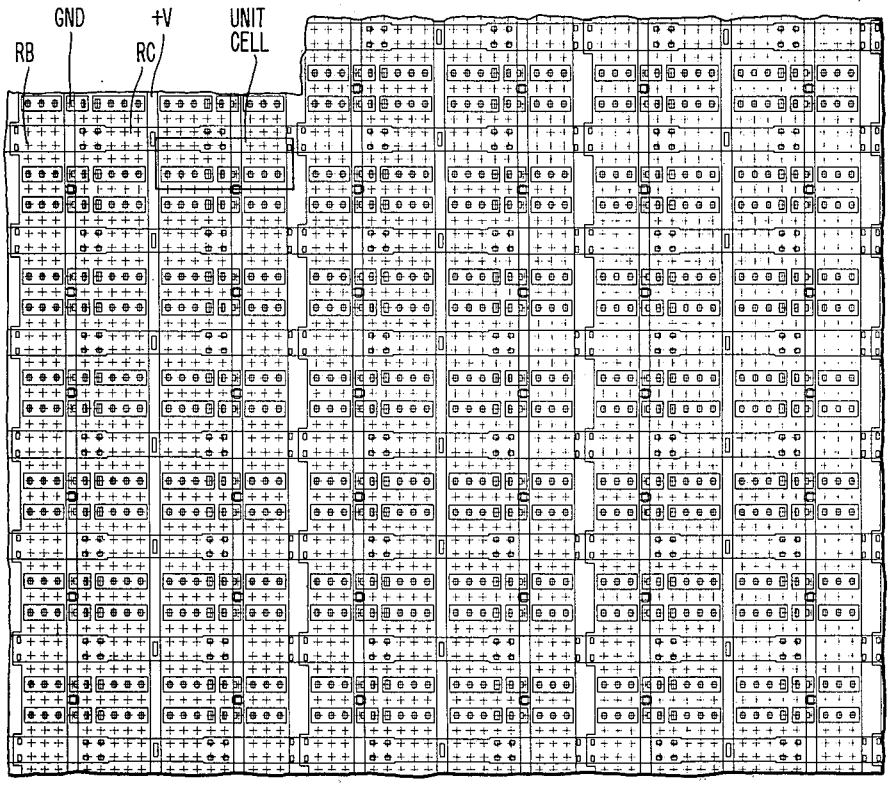
Figure 4:
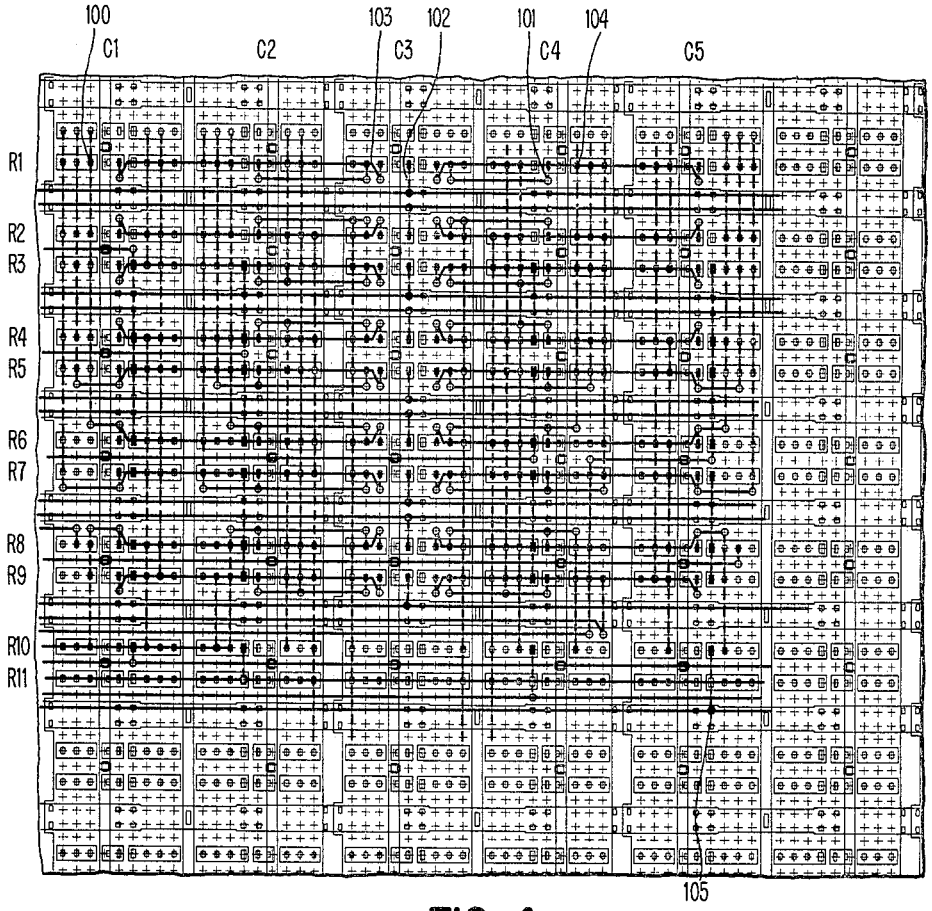
Figure 6:
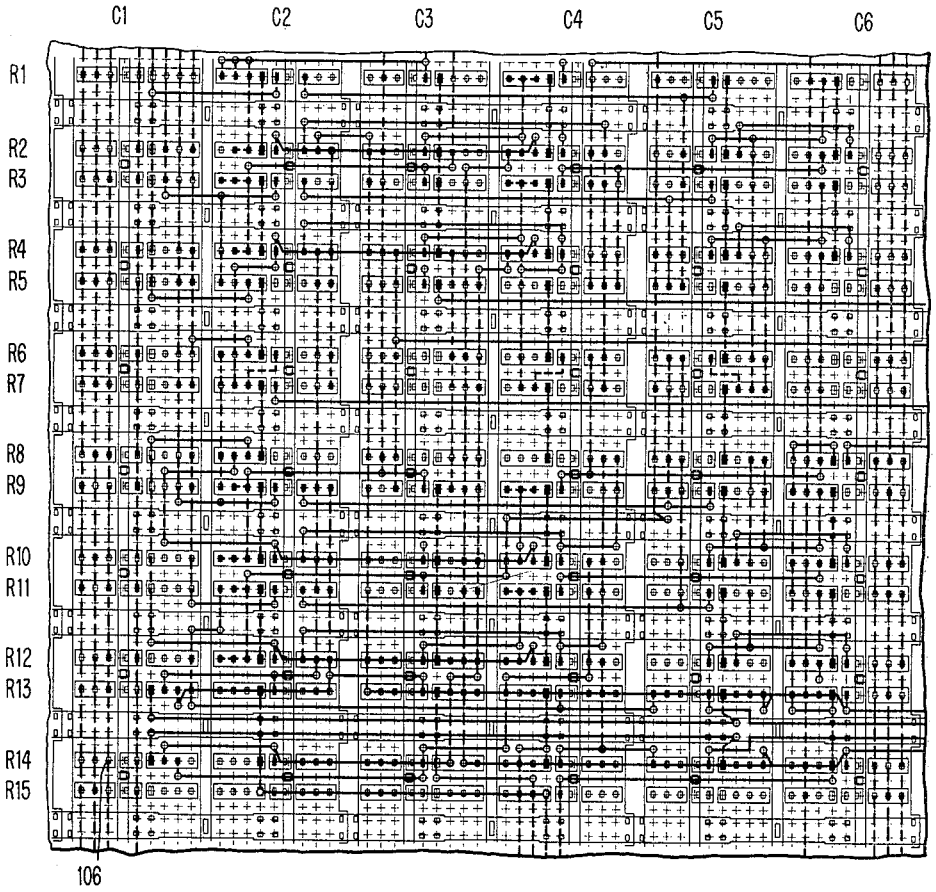
Figure 9:
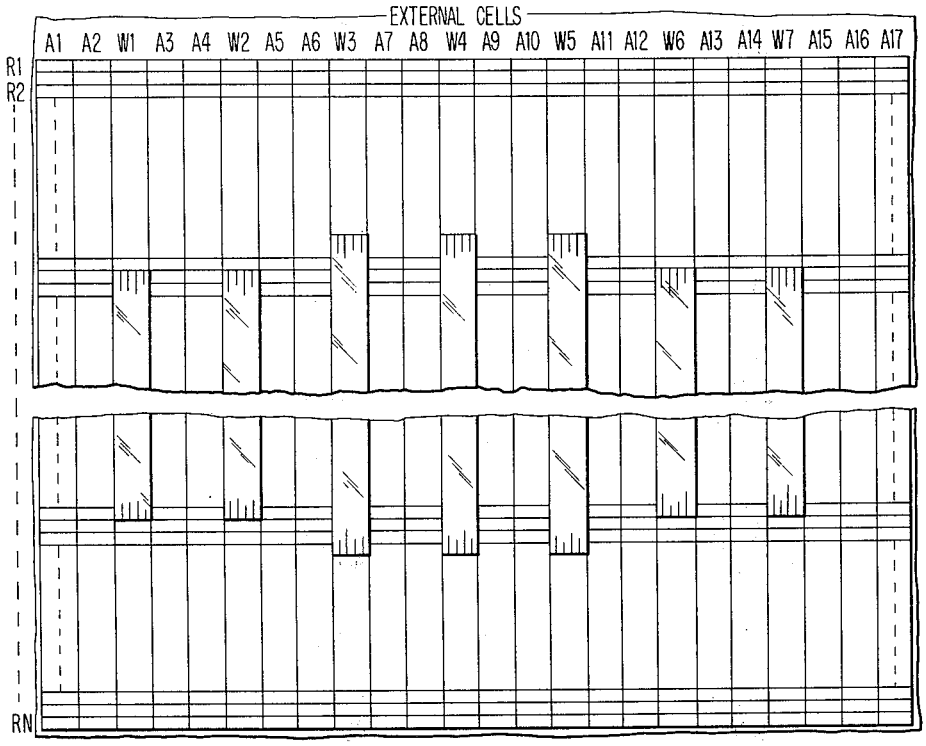
Figure 10:
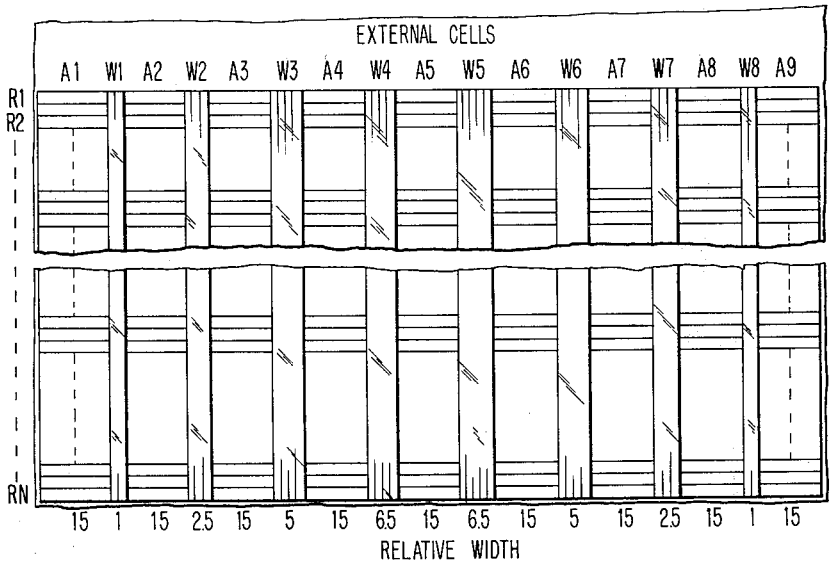

United States Defensive Publication [19] (H) [11] T101,804

Balyoz et al. [43] May 4, 1982

[54] INTEGRATED CIRCUIT LAYOUT UTILIZING SEPARATED ACTIVE CIRCUIT AND WIRING REGIONS

[76] Inventors: John Balyoz, Deerwood Dr., Hopewell Junction, N.Y. 12533; Algirdas J. Grwodis, 52 Edgehill Dr., Wappingers Falls, N.Y. 12590

[21] Appl. No.: 146,909

[22] Filed: May 5, 1980

Related U.S. Application Data

[60] Continuation of Ser. No. 9,712, Feb. 5, 1979, abandoned, which is a division of Ser. No. 830,715, Sep. 6, 1977, abandoned.

[51] Int. Cl.[3] ..... H01L 27/04

[52] U.S. Cl. ..... 357/71; 357/15; 357/45; 357/46; 357/92

[57] ABSTRACT

An LSI masterslice wiring technique, employing an array of elongated logic cells. A first level of metallization includes a first set of elongated, generally parallel conductors, orthogonal to the elongated logic cells and selectively contacting the cells. A second level of metal conductors, overlying and insulated from the first set, extends orthogonal to the first set, and thus parallel to the elongated logic cells. The second set includes both conductors passing over the areas of the logic cells and conductors lying between the logic cells. Conductors of the second set are selectively connected to conductors of the first set. This application has the same disclosure as that of Defensive Publication T100,501, published Apr. 7, 1981, but the abstracts are in conflict.

1 Claim, 6 Sheets Drawing,

30 Pages Specification

The file of this unexamined application may be inspected and copies thereof may be purchased (849 O.G. 1221, Apr. 9, 1968).

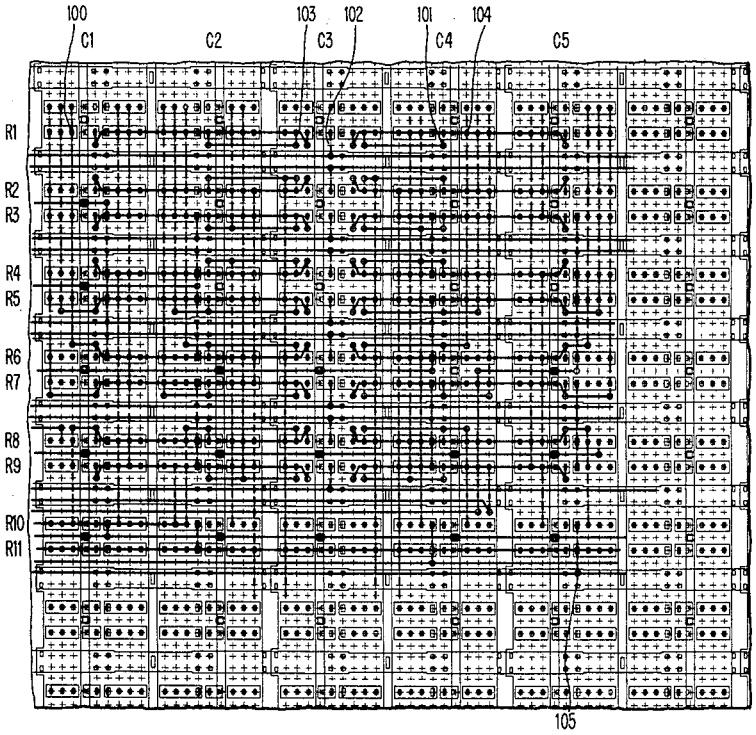

| | C1 | C2 | C3 | C4 | C5 |
|---|---|---|---|---|---|
| R1 | A | A | A | A | A |
| R2 | A | A | A | A | A |
| R3 | A | A | A | A | A |
| R4 | A | A | A | A | A |
| R5 | A | A | A | A | A |
| R6 | A | A | A | A | A |
| R7 | A | A | A | A | A |
| R8 | A | A | A | A | A |
| R9 | A | A | A | A | A |
| R10 | A | A | A | A | A |
| R11 | W | W | W | W | W |

FIG. 5

| | C1 | C2 | C3 | C4 | C5 | C6 |
|---|---|---|---|---|---|---|
| R1 | W | A | A | A | A | A W |
| R2 | W | A | A | A | A | A W |
| R3 | W | A | A | A | A | A W |
| R4 | W | A | A | A | A | A W |
| R5 | W | A | A | A | A | W |
| R6 | W | A | W | A | A | W |
| R7 | W | A | W | A | A | W |
| R8 | W | A | W | A | A | A W |
| R9 | W | A | A | A | A | A W |
| R10 | W | A | A | A | A | A W |
| R11 | W | A | A | A | A | A W |
| R12 | W | A | A | A | A | A W |
| R13 | W A | A | A | A | A | A W |
| R14 | W A | A | A | A | A | A W |
| R15 | W | W | W | W | W | W |

FIG. 7

| | C1 | C2 | C3 | C4 | C5 | C6 | C7 |
|---|---|---|---|---|---|---|---|
| R1 | W | A | A | A | W | A | A |
| R2 | W | A | A | A | W | A | A |
| R3 | W | A | A | A | W | A | A |
| R4 | W | A | A | A | W | A | A |
| R5 | W | A | A | A | W | A | A |
| R6 | W | A | A | A | W | A | A |
| R7 | W | A | A | A | W | A | A |
| R8 | W | A | A | A | W | A | A |
| R9 | W | W | W | W | W | W | W |
| R10 | W | A | A | A | W | A | A |
| R11 | W | A | A | A | W | A | A |
| R12 | W | A | A | A | W | A | A |

FIG. 8